(12) United States Patent
Yoo et al.

(10) Patent No.: US 7,790,591 B2
(45) Date of Patent: Sep. 7, 2010

(54) METHODS OF MANUFACTURING SEMICONDUCTOR DEVICES INCLUDING METAL OXIDE LAYERS

(75) Inventors: Dong-chul Yoo, Gyeonggi-do (KR); Myoung-bum Lee, Seoul (KR); Young-geun Park, Gyeonggi-do (KR); Han-mei Choi, Seoul (KR); Se-hoon Oh, Gyeonggi-do (KR); Byong-ju Kim, Gyeonggi-do (KR); Kyong-won An, Seoul (KR); Seon-ho Jo, Gyeongsangnam-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/270,014

(22) Filed: Nov. 13, 2008

(65) Prior Publication Data

US 2009/0124070 A1    May 14, 2009

(30) Foreign Application Priority Data

Nov. 13, 2007  (KR)  ............... 10-2007-0115491
Nov. 14, 2007  (KR)  ............... 10-2007-0116142
Oct. 9, 2008    (KR)  ............... 10-2008-0099349

(51) Int. Cl.
*H01L 21/3205* (2006.01)
*H01L 21/4763* (2006.01)

(52) U.S. Cl. ............... 438/591; 257/E21.294

(58) Field of Classification Search ............ 438/591; 257/E21.294
See application file for complete search history.

(56) References Cited

U.S. PATENT DOCUMENTS

| 6,709,989 B2 | 3/2004 | Ramdani et al. |
| 6,884,719 B2 | 4/2005 | Chang et al. |
| 2003/0047755 A1* | 3/2003 | Lee et al. ............ 257/200 |
| 2007/0020835 A1 | 1/2007 | Ahn et al. |
| 2007/0063266 A1 | 3/2007 | Natori et al. |

FOREIGN PATENT DOCUMENTS

| JP | 2003-258243 | 9/2003 |
| KR | 102006008573 | 7/2006 |

* cited by examiner

*Primary Examiner*—W. David Coleman
*Assistant Examiner*—Sonya D McCall-Shepard
(74) *Attorney, Agent, or Firm*—Myers Bigel Sibley & Sajovec

(57) ABSTRACT

Methods of manufacturing a semiconductor device are provided including forming a charge storage layer on a gate insulating layer that is on a semiconductor substrate. A blocking insulating layer is formed on the charge storage layer and an electrode layer is formed on the blocking insulating layer. The blocking insulating layer may be formed by forming a lower metal oxide layer at a first temperature and forming an upper metal oxide layer on the lower metal oxide layer at a second temperature, lower than the first temperature.

9 Claims, 13 Drawing Sheets

METHODS OF MANUFACTURING SEMICONDUCTOR DEVICES INCLUDING METAL OXIDE LAYERS

CLAIM OF PRIORITY

This application claims the benefit of Korean Patent Application No. 10-2007-0115491, filed on Nov. 13, 2007, 10-2007-116142, filed on Nov. 14, 2007 and 10-2008-0099349 filed on Oct. 9, 2008 in the Korean Intellectual Property Office, the disclosures of which are hereby incorporated herein by reference as if set forth in their entirety.

FIELD OF THE INVENTION

The present invention relates generally to semiconductor devices and, more particularly, to methods of fabricating semiconductor devices including metal oxide layers.

BACKGROUND OF THE INVENTION

Due to rapid developments in the electronic industry, the operating speed and integration of semiconductor devices are increasing all the time and, thus, semiconductor devices may require larger capacity. Accordingly, new characteristics may not be satisfied with conventional materials for manufacturing semiconductor devices and, thus, novel materials may need to be developed. However, it is possible that when these novel materials are used to manufacture semiconductor devices, desired characteristics of semiconductor devices may not be obtained due to process conditions and characteristics of materials used.

SUMMARY OF THE INVENTION

Some embodiments of the present invention provide methods of manufacturing a semiconductor device including forming a charge storage layer on a gate insulating layer that is on a semiconductor substrate. A blocking insulating layer is formed on the charge storage layer and an electrode layer is formed on the blocking insulating layer. The blocking insulating layer may be formed by forming a lower metal oxide layer at a first temperature and forming an upper metal oxide layer on the lower metal oxide layer at a second temperature, lower than the first temperature.

In further embodiments of the present invention, the lower metal oxide layer may be formed in-situ in a crystalline phase. In certain embodiments, the upper metal oxide layer may be formed in-situ in a crystalline phase using the lower metal oxide layer as a seed.

In still further embodiments, the upper metal oxide layer may be formed in an amorphous phase. The blocking insulating layer may be formed by heat-treating the upper metal oxide layer so that the upper metal oxide layer is crystallized. In certain embodiments, heat treating the upper metal oxide layer may include crystallizing the upper metal oxide layer using the lower metal oxide layer as a seed.

In some embodiments of the present invention, the lower metal oxide layer and the upper metal oxide layer may be formed using $AlCl_3$ as a precursor.

Further embodiments of the present invention provide methods of manufacturing a semiconductor device including forming a charge storage layer on a gate insulating layer that is on a semiconductor substrate. A blocking insulating layer is formed on the charge storage layer and an electrode layer is formed on the blocking insulating layer. Forming the blocking insulating layer may include forming a lower metal oxide layer in situ in a crystalline phase, forming an intermediate insulating layer in an amorphous phase and forming an upper metal oxide layer on the intermediate insulating layer.

In still further embodiments of the present invention, the intermediate insulating layer may have a lower dielectric constant than a dielectric constant of the lower metal oxide layer and the upper metal oxide layer.

In some embodiments of the present invention, the upper metal oxide layer may be formed in an amorphous phase. The blocking insulating layer may further include heat-treating the upper metal oxide layer so that the upper metal oxide layer is crystallized.

In further embodiments of the present invention, forming the upper metal oxide layer may include forming a first upper metal oxide layer in an amorphous phase and forming a second upper metal oxide layer in situ in a crystalline phase.

DETAILED DESCRIPTION OF SOME EMBODIMENTS OF THE INVENTION

Figure 1:
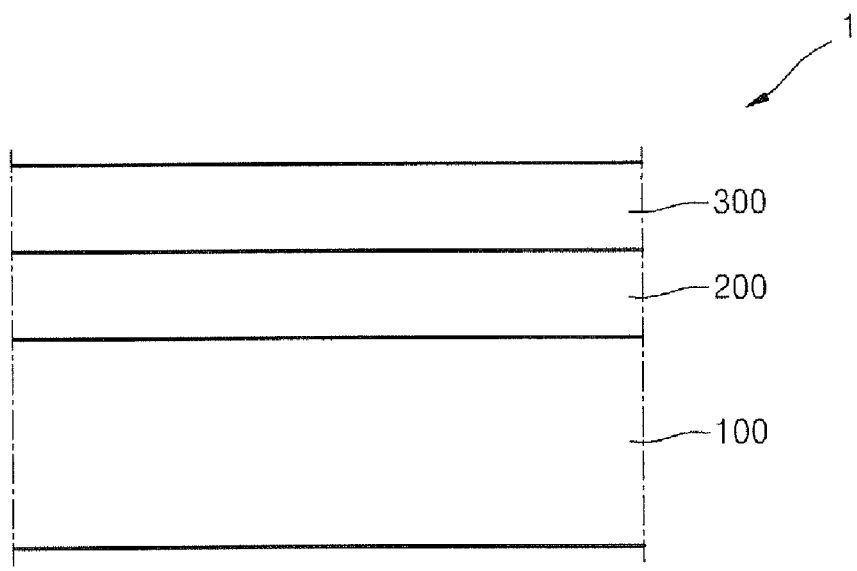
FIG. 1 is a cross-section illustrating a processing step in the fabrication of a charge storage layer on a gate insulating layer formed on a substrate according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "lower" and "upper" or "upper," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
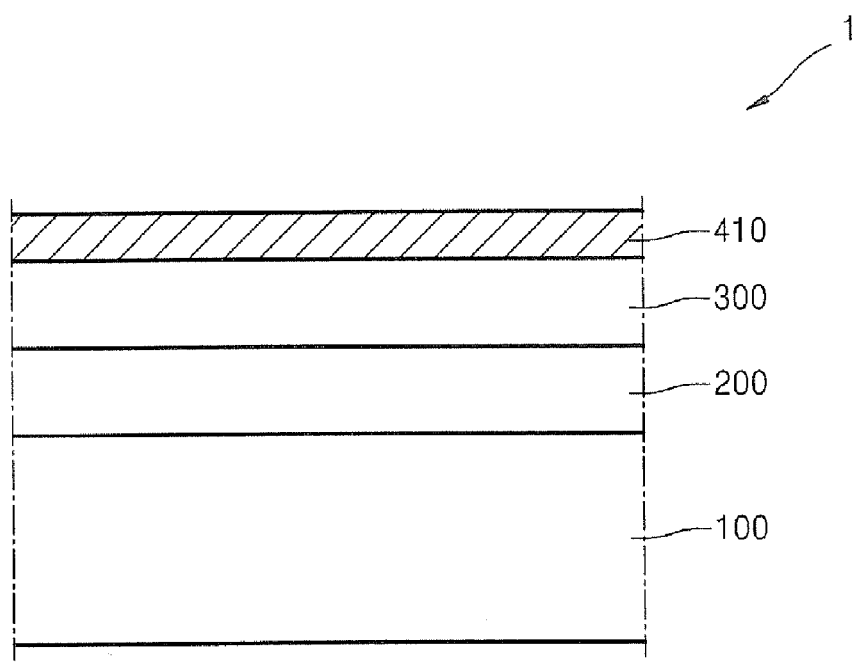
FIG. 2 a cross-section illustrating a processing step in the fabrication of a lower metal oxide layer according to some embodiments of the present invention.
Figure 3:
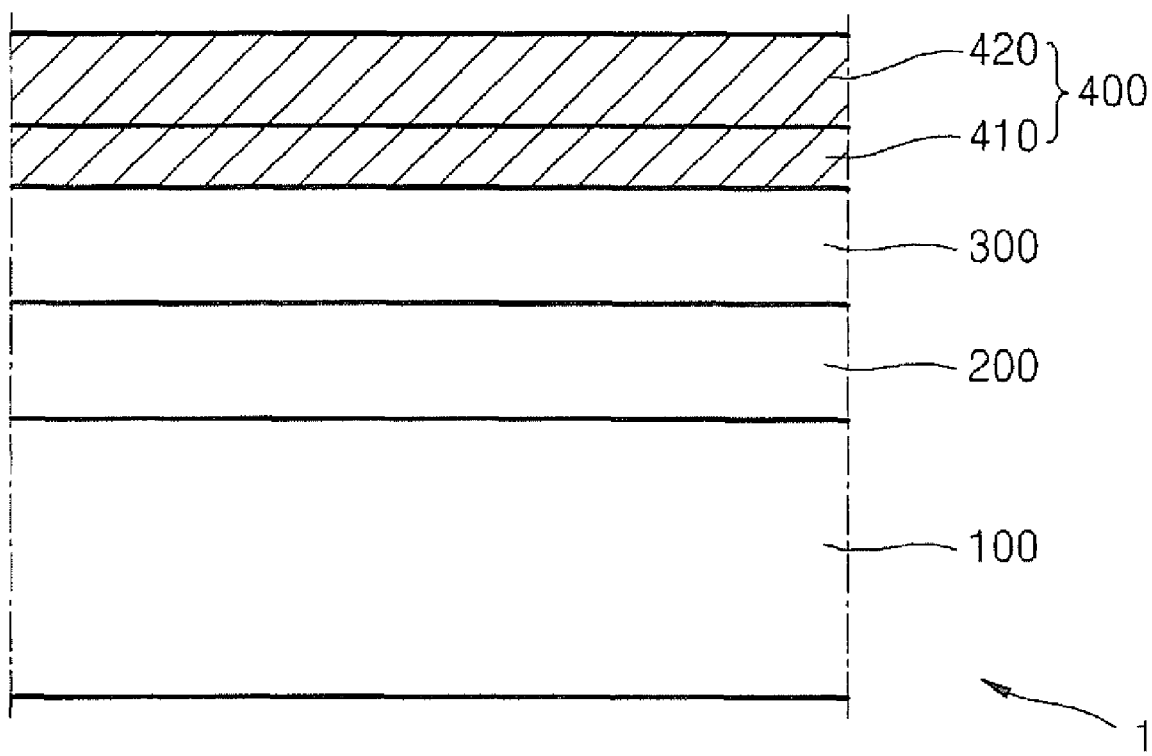
FIG. 3 is a cross-section illustrating a processing step in the fabrication of an upper metal oxide layer on a lower metal oxide layer according some embodiments of the present invention.

FIGS. 1 through 3 are cross-sections illustrating processing steps in the fabrication of metal oxide layers according to a process phase according to some embodiments of the present invention. Referring first to FIG. 1, a cross-section illustrating a processing step in the fabrication of a charge storage layer 300 on a gate insulating layer 200 on a substrate 100 according to some embodiments of the present invention will be discussed. As illustrated in FIG. 1, the substrate 100 may be a conventional semiconductor substrate, for example, a silicon substrate. The substrate 100 may include unit devices (not shown) to form a semiconductor device, such as a transistor. Furthermore, a device isolation layer (not shown) for separating the unit devices may be formed in the substrate 100. For example, the device isolation layer may be formed using, for example, a local oxidation of silicon (LOCOS) process or a shallow trench isolation (STI) process. An interlayer insulating layer (not shown) covering the unit devices may be formed on an upper surface of the substrate 100. In addition, the upper surface of the substrate 100 may expose conductive regions (not shown) that can be electrically connected to the unit devices through the interlayer insulating layer. Furthermore, conductive lines (not shown) connecting the unit devices or the conductive regions may be formed.

The gate insulating layer 200 may be formed on the substrate 100. The gate insulating layer 200 may be formed in such a way that a tunneling phenomenon may occur therein. The gate insulating layer 200 may have a thickness of, for example, from about 10 Å to about 100 Å. The gate insulating layer 200 may include, for example, a high-k or ferroelectric insulating layer that may be formed using a thermal oxidation process or a chemical vapor deposition process. The high-k or ferroelectric insulating layer may be a silicon oxide ($SiO_2$) layer or a hafnium or zirconium oxide layer.

The charge storage layer 300 may be formed on the gate insulating layer 200. The charge storage layer 300 may have a thickness of from about 20 Å to about 200 Å. The charge storage layer 300 may be formed of a conductive material or an insulating material. If the charge storage layer 300 is formed of a conductive material, the charge storage layer 300 functions as a floating gate. In these embodiments, the charge storage layer 300 may include, for example, a conductor including doped polysilicon or metal. Therefore, a semiconductor device to be formed may be a floating gate-type semiconductor device.

If the charge storage layer 300 is formed of an insulating material, the charge storage layer 300 may function as a charge storage insulating layer. In these embodiments, the charge storage layer 300 to be formed may function as a floating trap. Thus, a semiconductor device to be formed may be a floating trap-type semiconductor device. If the charge storage layer 300 functions as a floating trap, the charge storage layer 300 may include, for example, a nitride layer, such as a silicon nitride layer, an aluminum nitride layer, or a silicon oxynitride layer. In these embodiments, the charge storage layer 300 may be formed using a low pressure chemical vapor deposition (LPCVD) process. Alternatively, if the charge storage layer 300 functions as a floating trap, the charge storage layer 300 may include, for example, a high-k material that has a higher dielectric constant than silicon oxide, wherein the high-k material may be metal oxide, metal oxynitride, metal silicon oxide, or metal silicon oxynitride. Specifically, if the charge storage layer 300 functions as a floating trap, the charge storage layer 300 may include hafnium (Hf), zirconium (Zr), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

In some embodiments, the charge storage layer 300 may be formed of only a conductive material or an insulating material, or may have a multi-layer structure including the conductive material or the insulating material. For example, the charge storage layer 300 may have a multi-layer structure including a nitride layer and an oxide layer.

Referring now to FIG. 2, a cross-section illustrating a process of forming a lower metal oxide layer 410 according to some embodiments of the present invention will be discussed. As illustrated in FIG. 2, a reaction source including a metal precursor and a first oxidant are implanted on the charge storage layer 300 so that the metal precursor reacts with the first oxidant to form the lower metal oxide layer 410. The lower metal oxide layer 410 may include an oxide of hafnium (Hf), zirconium (Zr), tantalum (Ta), titanium (Ti), aluminum (Al), or a lanthanum-based element (Ln). Herein, the lanthanum-based element (Ln) may be lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

For example, the lower metal oxide layer 410 may include an aluminum oxide layer (alumina, $Al_2O_3$), and in this case, the metal precursor may be $AlCl_3$, but is not limited thereto. The first oxidant may be, for example, $CO_2$, a gaseous mixture including $CO_2$ and $H_2$, $O_2$, $O_3$ or $H_2O$. The lower metal oxide layer 410 may be formed by, for example, performing a chemical vapor deposition (CVD) process or an atomic layer deposition (ALD) process in a chamber under a pressure of about 10 Torr to about 25 Torr and at a first temperature.

The lower metal oxide layer 410 may be formed at high temperature so that the lower metal oxide layer 410 can be formed in an in-situ crystalline phase. As used herein, the phrase "forming in an in-situ crystalline phase" refers to a metal oxide layer that is deposited or grown in a crystalline phase during a deposition and growing process. The forming temperature may vary according to the type of a metal oxide layer, a lower substrate, or a process condition. For example, for an aluminum oxide layer ($Al_2O_3$), the lower metal oxide layer 410 may be formed in an in-situ crystalline phase at about 800° C., and for a hafnium oxide layer ($HfO_2$), the lower metal oxide layer 410 may be formed in an in-situ crystalline phase at about 900° C. If the lower metal oxide layer 410 is formed at a temperature lower than 800° C., the lower metal oxide layer 410 may not be formed in an in-situ crystalline phase. On the other hand, if the lower metal oxide layer 410 is formed at a temperature higher than 1,300° C., the lower metal oxide layer 410 may be quickly formed in an in-situ crystalline phase. However, maintaining a high temperature is technically difficult. Accordingly, the lower metal oxide layer 410 may be formed at the first temperature of, for example, from about 800° C. to about 1300° C.

Furthermore, to be used as a seed, the lower metal oxide layer 410 may be formed to be thinner than a blocking insulating layer. The thickness of the lower metal oxide layer 410 may be, for example, from about 5.0 Å to about 150 Å.

A process of forming the lower metal oxide layer 410 including aluminum oxide on the charge storage layer 300 by CVD will be now be discussed. First, to perform CVD, the substrate 100 on which the charge storage layer 300 is formed is placed into a process chamber (not shown). In these embodiments, the temperature of the process chamber may be maintained at a temperature of from about 800° C. to about 1,300° C. If the temperature of the process chamber is lower than about 800° C., the lower metal oxide layer 410 may not be crystallized. On the other hand, if the temperature of the process chamber is higher than about 1,300° C., the lower metal oxide layer 410 may be quickly crystallized but maintaining such a high temperature may be technically difficult. Accordingly, the temperature of the process chamber may be controlled to be, for example, from about 850° C. to about 950° C. The pressure of the process chamber may be controlled to be, for example, about 10 Torr to about 25 Torr. For example, the pressure of the process chamber may be controlled to be from about 15 Torr to about 20 Torr. In the process chamber, the temperature may be maintained at about 900° C. and the pressure may be maintained at about 15 Torr.

A metal precursor including Al and a first oxidant are supplied to the substrate 100 loaded in the process chamber to form a lower aluminum oxide layer on the charge storage layer 300. The metal precursor may be delivered by a carrier gas, such as nitrogen gas or argon gas. The metal precursor including Al and the carrier gas may be supplied to the substrate 100 at a flow rate of about 0.05 slm (standard litters per minute) to about 0.30 slm. In addition, the metal precursor including Al may be supplied using a liquid delivery system (LDS) or a bubbler system.

In some embodiments of the present invention, the metal precursor including Al may include $AlCl_3$. Since as a conventional Al-containing metal precursor, trimethyl aluminum (TMA, $Al(CH_3)_3$) or a triethyl aluminum (TEA, $Al(C_2H_5)_3$) is decomposed at a temperature of about 400° C. or higher, the Al precursor including $AlCl_3$ that is stable at high temperature may be used to form the lower metal oxide layer 410 having appropriate characteristics. Furthermore, the first oxidant may include $CO_2$, a gaseous mixture including $CO_2$ and $H_2$, $O_2$, $O_3$ or $H_2O$. Those gases may be used alone and in some cases, in combinations. For example, $AlCl_3$ gas as the metal precursor including Al and the gaseous mixture including $CO_2$ and $H_2$ as the first oxidant may be supplied to the charge storage layer 300 at a flow rate of about 0.1 slm. In these embodiments, the flow rate of $CO_2$ to $H_2$ in the first oxidant may be about 1:1. For example, the first oxidant may include about 2 L of $CO_2$ and about 10 L of $H_2$. When the metal precursor including Al reacts with the first oxidant, the lower metal oxide layer 410 including aluminum oxide may be formed on the charge storage layer 300. For example, the lower metal oxide layer 410 may be formed to a thickness of from about 5.0 Å to about 150 Å on an upper surface of the charge storage layer 300.

Referring now to FIG. 3, a cross-section illustrating a processing step in the formation of an upper metal oxide layer 420 on the lower metal oxide layer 410 according to some embodiments of the present invention will be discussed. As illustrated in FIG. 3, the upper metal oxide layer 420 may be formed in situ in the crystalline phase using the lower metal oxide layer 410 as a seed. Specifically, a reaction source including a metal precursor and a second oxidant is supplied onto the lower metal oxide layer 410 and the metal precursor reacts with the second oxidant and thus, the upper metal oxide layer 420 is formed in situ in the crystalline state using the lower metal oxide layer 410 as a seed. The upper metal oxide layer 420 may include an oxide of the same element as in the lower metal oxide layer 410. That is, like the lower metal oxide layer 420, the upper metal oxide layer 420 may include an oxide of hafnium (Hf), zirconium (Zr), tantalum (Ta), titanium (Ti), aluminum (Al), or a lanthanum-based element (Ln). Herein, the lanthanum-based element (Ln) may be lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

For example, when the lower metal oxide layer 410 is an aluminum oxide layer (alumina, $Al_2O_3$), the upper metal oxide layer 420 may be formed using $AlCl_3$ as the metal precursor to be an aluminum oxide layer. However, the lower metal oxide layer 410 and the upper metal oxide layer 420 are not limited to oxide layers of the same element, and can be oxide layers having different metal elements having similar lattice constants.

Since the upper metal oxide layer 420 is formed in situ in the crystalline phase using the lower metal oxide layer 410 as a seed, the lower metal oxide layer 410 may be formed in situ in the crystalline phase at a second temperature, wherein the second temperature is lower than the first temperature at which the lower metal oxide layer 410 is formed. The second temperature may vary according to the type of metal oxide layer, lower substrate, or process condition. When a seed is not used, an aluminum oxide ($Al_2O_3$) layer can be formed in situ in a crystalline phase at about 800° C., and a hafnium oxide ($HfO_2$) layer be formed in situ in a crystalline phase at about 900° C. Accordingly, the upper metal oxide layer 420 can be formed at a temperature lower than 800° C. or 900° C. However, in the case in which the second temperature is too low, even when the lower metal oxide layer 410 is used as a seed, the upper metal oxide layer 420 may not be formed in situ in the crystalline phase. Thus, the second temperature for forming the upper metal oxide layer 420 may be from 500° C. to 950° C. Specifically, when the upper metal oxide layer 420 is formed by ALD, the ALD cannot be applied when the temperature is too high. Thus, in these embodiments, the temperature may be from about 500° C. to about 700° C.

For example, when the lower metal oxide layer 410 is formed at 800° C., the upper metal oxide layer 420 may be formed at a temperature less than 800° C. In addition, for example, when the lower metal oxide layer 410 is formed at a temperature higher than 950° C., the upper metal oxide layer 420 may be formed at 950° C. or lower.

Accordingly, a heat budget used to form the upper metal oxide layer 420 in an in-situ crystalline phase may be substantially reduced. Furthermore, the lower metal oxide layer 410 that is crystallized functions as a barrier against flow of oxygen atoms and thus, oxidation of a lower layer due to diffusion of oxygen, which occurs when the upper metal oxide layer 420 is formed, may be inhibited or possibly prevented.

The second oxidant used to form the upper metal oxide layer 420 may be, for example, $CO_2$, a gaseous mixture including $CO_2$ and $H_2$, $O_2$, $O_3$ or $H_2O$. The second oxidant may be the same as or different from the first oxidant used to form the lower metal oxide layer 410. When a metal oxide layer is formed using an oxidant having high oxidization power, a lower layer may be oxidized or the thickness distribution of the metal oxide layer may be wide. On the other hand, when a metal oxide layer is formed using an oxidant having low oxidization power, crystallinity may be degraded. Accordingly, the first oxidant and the second oxidant may be selectively chosen according to oxidation of the lower layer, the thickness distribution, or crystallinity.

The lower metal oxide layer 410 and the upper metal oxide layer 420 together constitute a blocking insulating layer 400. The blocking insulating layer 400 may have a thickness of from about 50 Å to about 400 Å. In these embodiments, the thickness of the blocking insulating layer 400 minus the thickness of the lower metal oxide layer 410 used as a seed may be equal to the thickness of the upper metal oxide layer 420. However, the blocking insulating layer 400 may be formed by repeatedly forming a multi-layer structure including the lower metal oxide layer 410 used as a seed and the upper metal oxide layer 420.

Although not illustrated, the lower metal oxide layer 410 may be formed at a relatively high temperature and the upper metal oxide layer 420 may be formed at a relatively low temperature using the lower metal oxide layer 410 as a seed, and then, another lower metal oxide layer may be formed at a relatively high temperature and another upper metal oxide layer may be formed at a relatively low temperature using the lower metal oxide layer as a seed, thereby forming the blocking insulating layer 400. In addition, the cycle of forming a lower metal oxide layer and forming an upper metal oxide layer can be repeated for three or more times. Meanwhile, when the upper metal oxide layer 420 is formed at a relatively low temperature using the lower metal oxide layer as a seed, the crystallinity of the upper metal oxide layer 420 is decreased. However, if the blocking insulating layer 400 is formed to a large thickness, such decrease may be inhibited or possibly prevented.

Figure 4A:
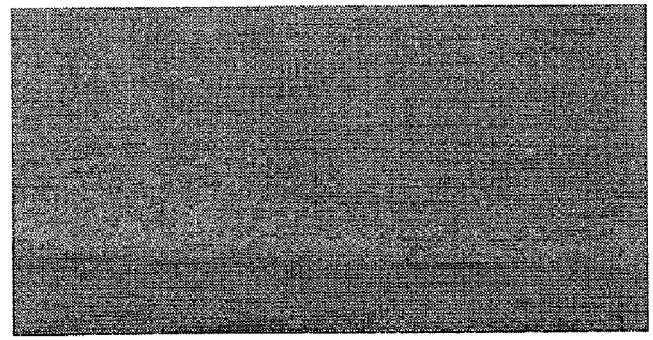
FIG. 4A is a scanning electron microscopic (SEM) image illustrating a conventional blocking insulating layer.
Figure 4B:
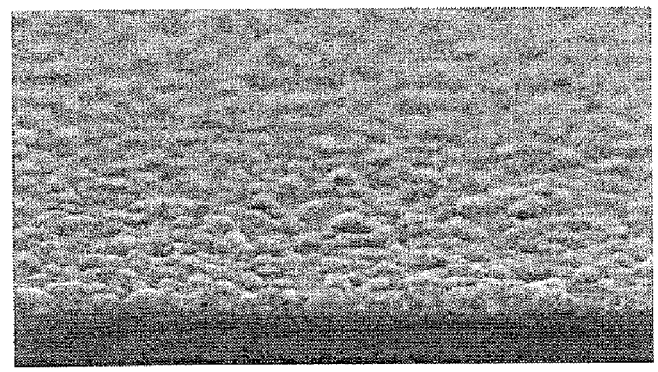
FIG. 4B is an SEM image illustrating a blocking insulating layer formed according to some embodiments of the present invention.

FIG. 4A is a scanning electron microscopic (SEM) image of a conventional blocking insulating layer, and FIG. 4B is an SEM image of a blocking insulating layer formed according to some embodiments of the present invention. The blocking insulating layers shown in FIGS. 4A and 4B are aluminum oxide layers formed using $AlCl_3$ as a metal oxide precursor and the same oxidant at the same temperature of about 750° C.

Referring to FIG. 4A, the conventional blocking insulating layer formed at about 750° C. is not crystallized and is in an amorphous phase. However, referring to FIG. 4B, although the process temperature is the same, the blocking insulating layer according to some embodiments of the present invention, which constitutes an aluminum oxide layer formed at 750° C. as an upper metal oxide layer using an aluminum oxide layer formed at 900° C. as a lower metal oxide layer as a seed, is formed in situ in the crystalline phase.

Figure 4C:
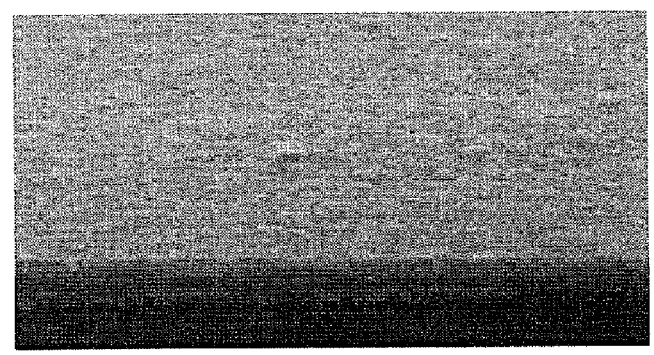
FIG. 4C is an SEM image illustrating a blocking insulating layer formed according to some embodiments of the present invention.

FIG. 4C is an SEM image of a blocking insulating layer formed according to some embodiments of the present invention. Referring to FIG. 4C, the surface roughness of the blocking insulating layer according to the present embodiment is less than that of the blocking insulating layer shown in FIG. 4B. The aluminum oxide layer shown in FIG. 4B as an upper metal oxide layer is formed at 750° C. by CVD, and the aluminum oxide layer shown in FIG. 4C as an upper metal oxide layer is formed at 600° C. by ALD. Each of the blocking insulating layers shown in FIGS. 4B and 4C includes a lower metal oxide layer, that is, an aluminum oxide layer, formed at 900° C. and used as a seed.

In general, a metal oxide layer that is crystallized at a relatively low temperature has less surface roughness than a metal oxide layer that is formed at a relatively high temperature. When the temperature is the same, a metal oxide layer formed using ALD has less surface roughness than a metal oxide layer formed using CVD. However, unlike CVD, ALD uses an adsorption method to form a metal oxide layer. Thus, since the adsorption method cannot be used at about 700° C. or higher, ALD cannot be used at such high temperature. Accordingly, at a temperature at which it is suitable to perform ALD, unless a crystalline lower metal oxide layer is used as a seed, it is difficult to form a metal oxide layer in a crystalline form.

Figure 5:
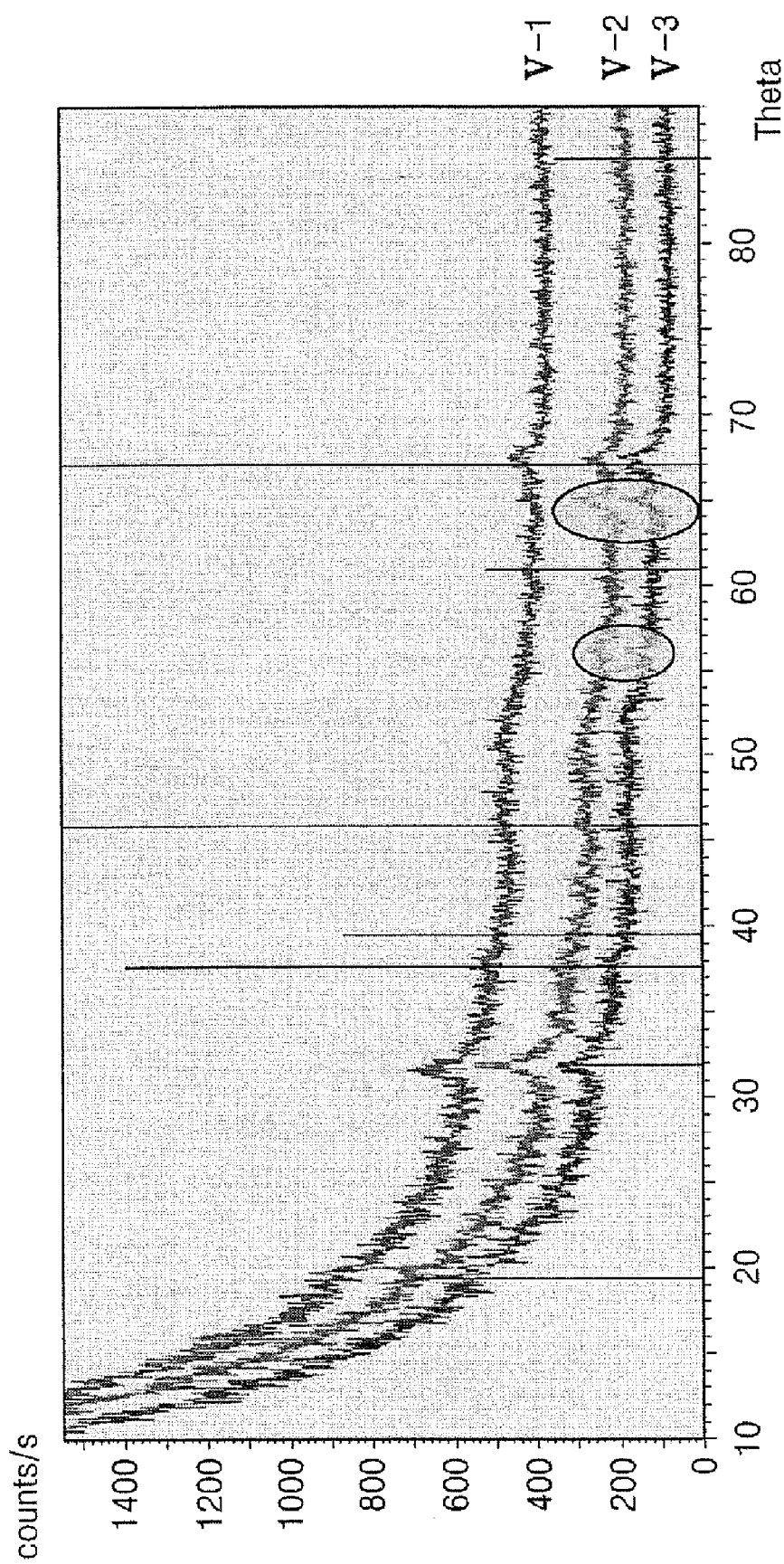
FIG. 5 is a graph illustrating X-ray diffraction (XRD) analysis results of an aluminum oxide layer according to some embodiments of the present invention.

FIG. 5 is a graph illustrating X-ray diffraction (XRD) analysis results of an aluminum oxide layer according to whether a seed is used and a seed forming temperature. Referring to FIG. 5, unlike when a lower metal oxide layer is used as a seed and an aluminum oxide layer is formed as an upper metal oxide layer (V-2 and V-3), when a lower metal oxide layer used as a seed is not formed and an aluminum oxide layer is formed on a silicon nitride (SiN) layer at 750° C. (V-1), crystallinity of the aluminum oxide layer cannot be identified. However, when an aluminum oxide layer is formed at the same temperature of 750° C. and a lower metal oxide layer used as a seed is formed (V-2 and V-3), crystallinity of the aluminum oxide layer that is the upper metal oxide layer is identified (see circled portions of graph). In addition, when the lower metal oxide layer used as the seed is formed at higher temperature, that is, when the lower metal oxide layer is formed at 950° C. (V-3), crystallinity of the aluminum oxide layer that is the upper metal oxide layer is better than when the lower metal oxide layer is formed at 900° C. (V-2) (see the left circled portion of graph)

Figure 6:
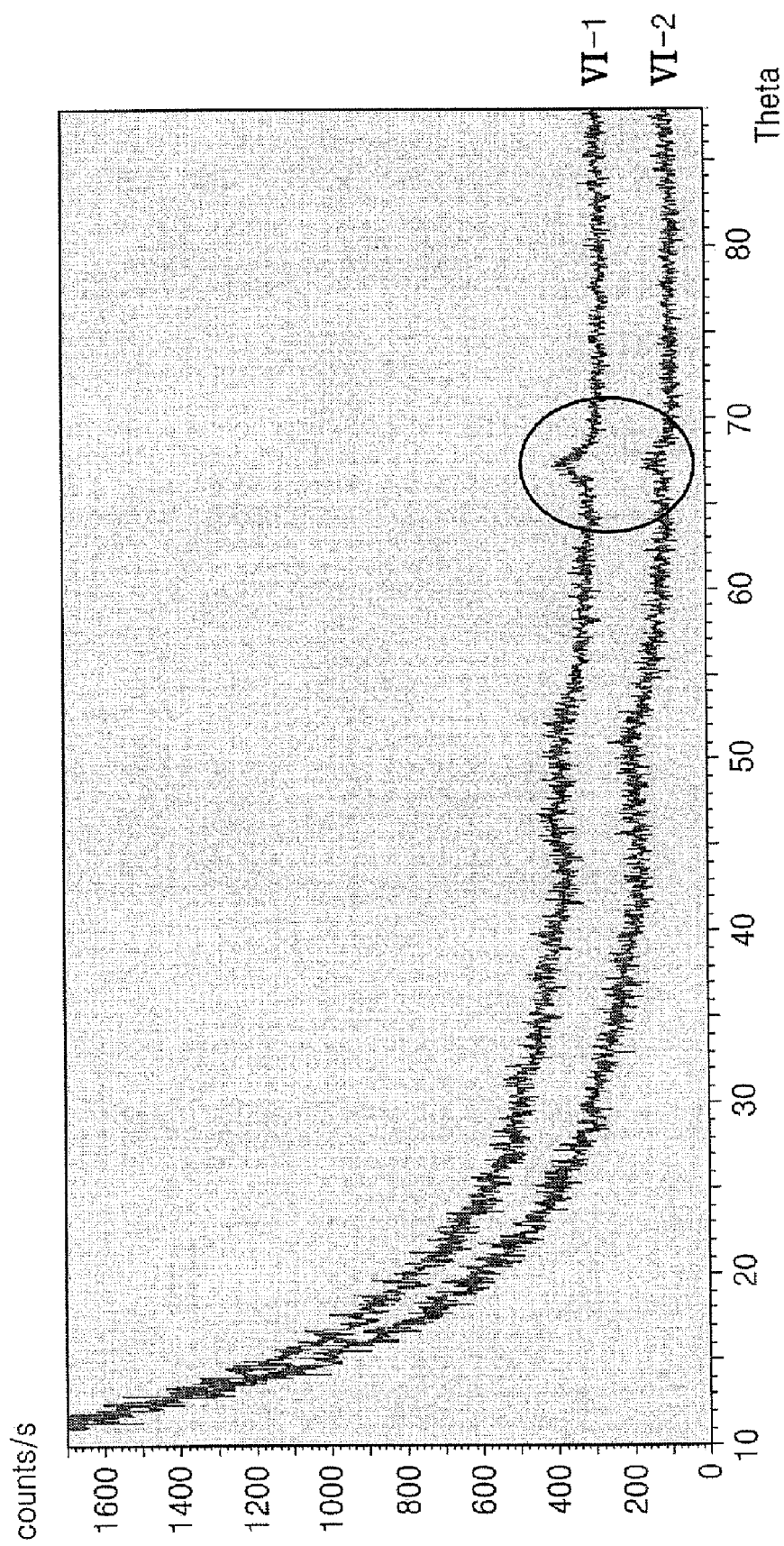
FIG. 6 is a graph illustrating XRD analysis results of a layer quality of an aluminum oxide layer according to some embodiments of the present invention.

FIG. 6 is a graph illustrating XRD analysis results of a layer quality of an aluminum oxide layer according to a temperature at which the aluminum oxide layer is formed on a seed. Referring to FIG. 6, crystallinity of an aluminum oxide layer that is an upper metal oxide layer formed at 650° C. using a lower metal oxide layer formed at 900° C. as a seed (VI-1) and crystallinity of an aluminum oxide layer that is an upper metal oxide layer formed at 600° C. using a lower metal oxide layer formed at 900° C. as a seed (VI-2) are identified based on XRD analysis results (see circled portion of graph). Furthermore, the aluminum oxide layer that is the upper metal oxide layer formed at 650° C. (VI-1) has better crystallinity than the aluminum oxide layer that is the upper metal oxide layer formed at 600° C. (VI-2) (see circled portion of graph).

As illustrated in FIGS. 4A to 6, it can be identified that even at low temperature, a crystallized upper metal oxide layer can be obtained when a lower metal oxide layer that is formed in situ in a crystalline phase is used as a seed. In addition, it can be identified that when the upper metal oxide layer is formed at the same temperature using the lower metal oxide layer as a seed, a higher forming temperature of the lower metal oxide layer used as a seed results in better crystallinity of the upper metal oxide layer. Furthermore, it can be identified that when the lower metal oxide layer formed at the same temperature is used as a seed, a higher forming temperature of the upper metal oxide layer used as a seed results in better crystallinity of the upper metal oxide layer.

When the lower metal oxide layer that is formed in situ in a crystalline phase is used as a seed, the upper metal oxide layer that is formed in situ in a crystalline phase can also be obtained even at a temperature at which it is suitable to perform ALD and thus, the surface roughness may be reduced.

Figure 7:
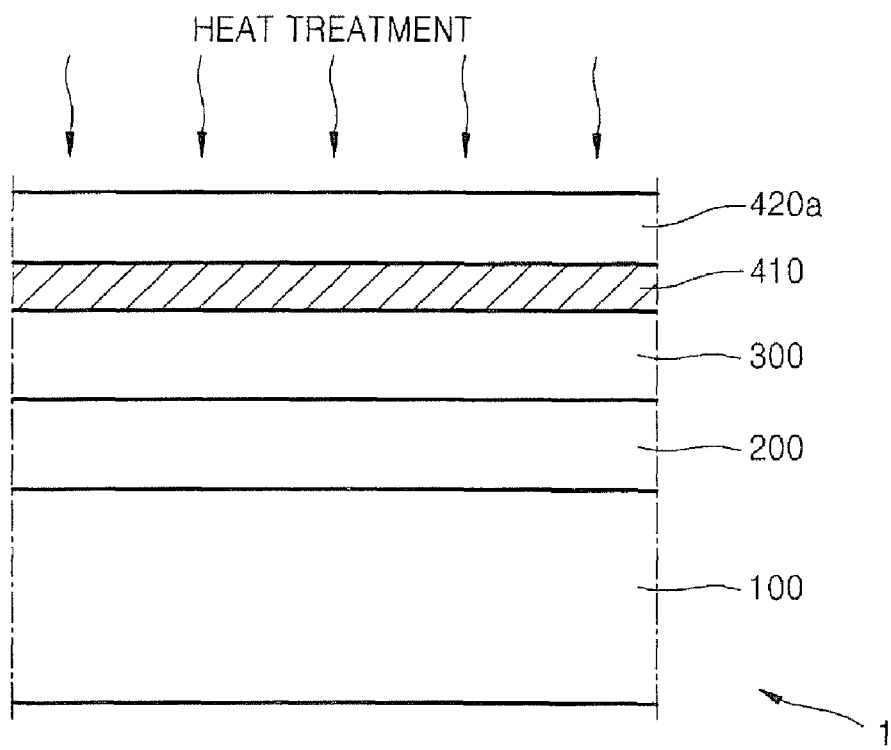
FIG. 7 is a cross-section illustrating a processing step in the fabrication of a preliminary upper metal oxide layer on a lower metal oxide layer according to some embodiments of the present invention.

FIG. 7 is a cross-section illustrating a process of forming a preliminary upper metal oxide layer 420a on a lower metal oxide layer 410, according to some embodiments of the present invention. Referring to FIG. 7, the preliminary upper metal oxide layer 420a is formed on the lower metal oxide layer 410. For example, each of the lower metal oxide layer 410 and the preliminary upper metal oxide layer 420a may be formed of metal oxide such as aluminum oxide.

The preliminary upper metal oxide layer 420a may be formed in an amorphous phase on the lower metal oxide layer 410 at a second temperature by CVD or ALD. The second temperature is relatively lower than a first temperature at which the lower metal oxide layer 410 is formed. For example, the second temperature may be about 200° C. to about 700° C. and the first temperature may be from about 800° C. to about 1,300° C.

As discussed above, the lower metal oxide layer 410 may be formed to a thickness of from about 5.0 Å to about 150 Å. For example, the lower metal oxide layer 410 may be formed to a thickness of about 100 Å on a charge storage layer 300. Such a thickness of the lower metal oxide layer 410 may be a critical thickness at which the crystalline characteristic of the lower metal oxide layer 410 is maintained when the lower metal oxide layer 410 is formed at the first temperature. In embodiments of the present invention in which the thickness of the lower metal oxide layer 410 is greater than about 150 Å, even when the lower metal oxide layer 410 is formed at a relatively high temperature such as the first temperature, the crystalline characteristic of the lower metal oxide layer 410 is degraded and thus, it is difficult to use the lower metal oxide layer 410 as a seed to crystallize the preliminary upper metal oxide layer 420a.

Since the lower metal oxide layer 410 is formed at a relatively high temperature and has excellent crystalline characteristic, the lower metal oxide layer 410 can sufficiently function as a seed to crystallize the preliminary upper metal oxide layer 420a that is in the amorphous phase during a post heat treatment process performed after the formation of the preliminary upper metal oxide layer 420a. Since the lower metal oxide layer 410 functions as a seed, even when the heat treatment temperature is lower than when a seed is not used, the preliminary upper metal oxide layer 420*a* can be crystallized. Thus, the heat budget of the post heat treatment process for crystallizing the preliminary upper metal oxide layer 420*a* may be significantly reduced. Furthermore, since the lower metal oxide layer 410 that is crystallized is disposed under the preliminary upper metal oxide layer 420*a* and functions as a barrier against flow of oxygen atoms, the post heat treatment process of the preliminary upper metal oxide layer 420*a* that is disposed on the lower metal oxide layer 410 may be performed at high temperature without diffusion of oxygen. Through the post heat treatment process, like in FIG. 3, a crystallized upper metal oxide layer can be formed.

Figure 8:
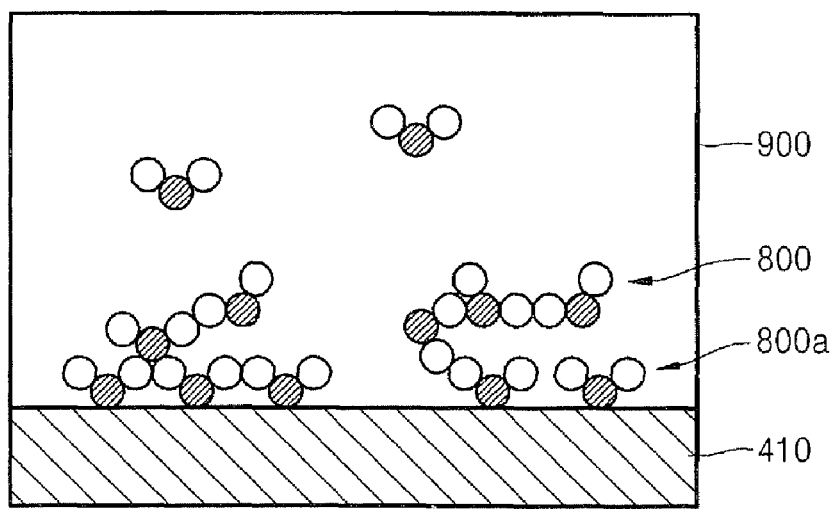
FIG. 8 through 11 are cross-sections illustrating processing steps in the fabrication of a preliminary upper metal oxide layer on a lower metal oxide layer by atomic layer deposition (ALD) according to some embodiments of the present invention.

FIGS. 8 through 11 are cross-sections illustrating processing steps in the fabrication of a preliminary upper metal oxide layer on a lower metal oxide layer 410 by ALD according to some embodiments of the present invention. Referring first to FIG. 8, a substrate on which the lower metal oxide layer 410 is formed is loaded into a chamber 900 that is used to perform ALD, wherein the temperature of the chamber 900 may be a second temperature which is a relatively low temperature of from about 200° C. to about 700° C. The pressure of the chamber 900 may be from about 0.1 Torr to about 3.0 Torr. For example, the chamber 900 may have a second temperature of, for example, about 450° C. and a pressure of about 1.0 Torr. When a preliminary upper metal oxide layer (see 420*a* of FIG. 4) is formed in such temperature and pressure conditions, reactivity of reactants may be appropriately maintained but the preliminary upper metal oxide layer (see 420*a* of FIG. 4) may not be completely crystallized and thus be in an amorphous phase.

A reactant 800 including an Al precursor is supplied onto the lower metal oxide layer 410 to form a first adsorption layer including Al on the lower metal oxide layer 410. The Al precursor included in the reactant 800 may be in a gaseous state, and may be delivered by a carrier gas, such as nitrogen gas or argon gas. For example, each of the reactant 800 and the carrier gas may be supplied at a flow rate of about 0.05 slm to about 0.30 slm. The Al precursor may include AlCl3, and the reactant 800 may be supplied onto the lower metal oxide layer 410 for about 0.5 seconds to 3 seconds.

A first portion 800*a* of the reactant 800 may be adsorbed on the lower metal oxide layer 410 to form the first adsorption layer, and a second portion of the reactant 800, which does not form the first adsorption layer, floats in the chamber 900.

Figure 9:
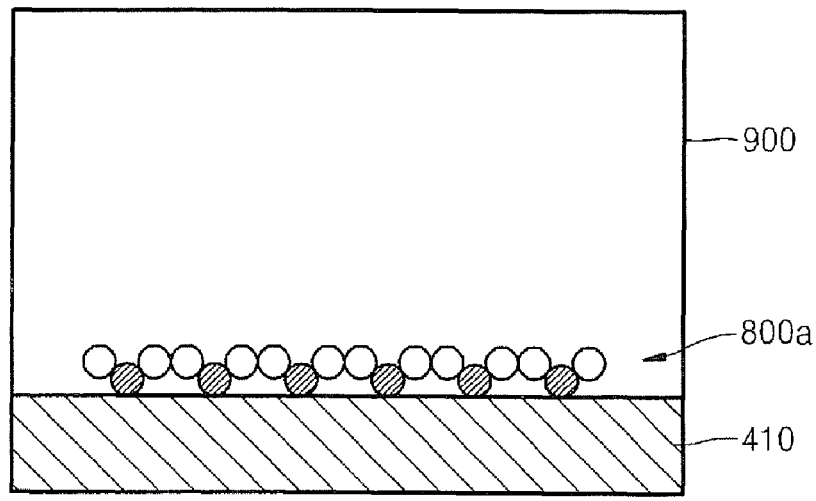

Referring now to FIG. 9, a first purge gas is supplied into the chamber 900. The first purge gas may include nitrogen gas or argon gas, and may be supplied for from about 1.0 second to about 5.0 seconds. The second portion of the reactant 800 floating in the chamber 900 may be exhausted from the chamber 900, together with the first purge gas supplied into the chamber 900.

Figure 10:
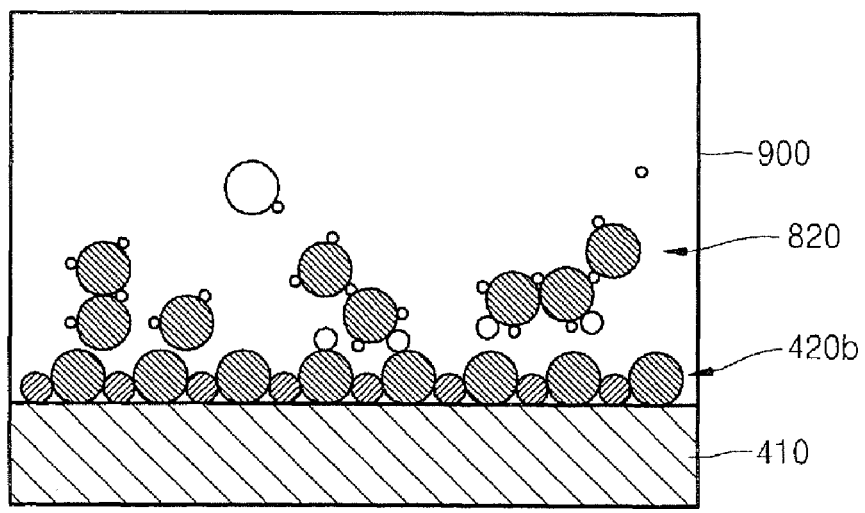

Referring now to FIG. 10, a second oxidant 820 is supplied onto the lower metal oxide layer 410 to oxidize the first adsorption layer, thereby forming a second adsorption layer 420*b* including an aluminum oxide on the lower metal oxide layer 410. The second oxidant 820 may include $CO_2/H_2$, $CO_2$, $O_3$, $O_2$, or $H_2O$. These gases may be used alone or, in some cases, in combinations. For example, $O_3$ as the second oxidant 820 may be supplied onto the first adsorption layer for about 1 second to about 5.0 seconds to form the second adsorption layer 420*b*.

Figure 11:
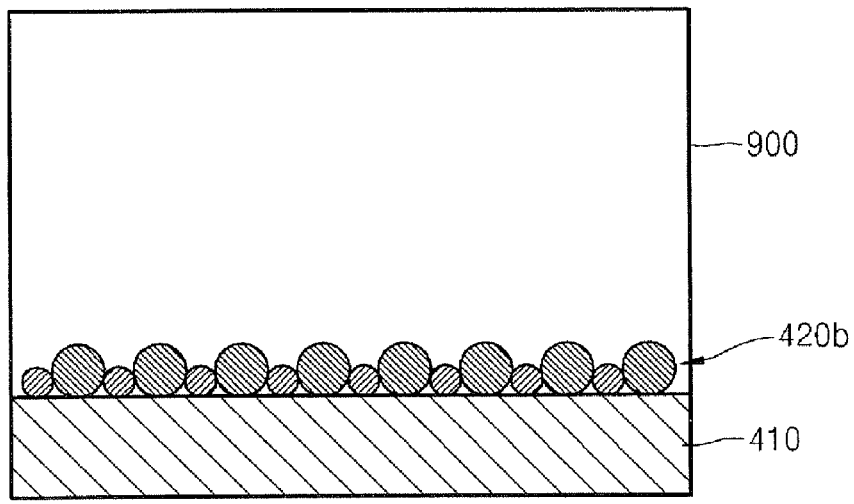

Referring now to FIG. 11, a second purge gas is supplied onto the lower metal oxide layer 410 to remove by-products from the chamber 900, wherein the by-products are generated when the Al precursor reacts with the second oxidant 820 and the residual second oxidant 820. The second purge gas may be supplied for about 1.0 second to about 5.0 seconds, and may include an inert gas, such as nitrogen gas or helium gas. For example, the second purge gas may be supplied into the chamber 900 for about 3.0 seconds.

The cycle for forming the second adsorption layer 420*b* may be repeatedly performed until a preliminary upper metal oxide layer (see 420*a* of FIG. 4) having a desirable thickness is formed. For example, the cycle for forming the second adsorption layer 420*b* may be repeatedly performed for about 100 times to about 250 times.

Figure 12:
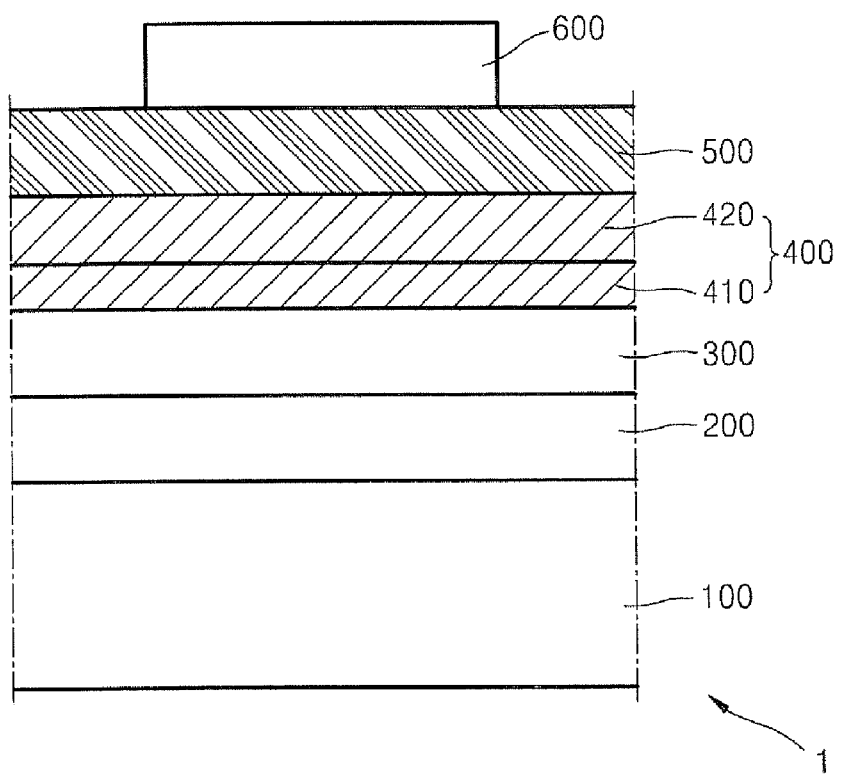
FIG. 12 is a cross-section illustrating a processing step in the fabrication of an electrode layer and a mask pattern according to some embodiments of the present invention.

FIG. 12 is a cross-section illustrating a process of forming an electrode layer 500 and a mask pattern 600 according to some embodiments of the present invention.

Referring to FIG. 12, the electrode layer 500 may be formed on a blocking insulating layer 400, and the mask pattern 600 may be formed on the electrode layer 500. The mask pattern 600 may be, for example, a photoresist pattern or a hard mask pattern. The blocking insulating layer 400 may formed using the processes described with reference to FIGS. 2 through 3, and 7 through 11.

The electrode layer 500 may include, for example, impurity-doped polysilicon, metal or metal silicide having a work function of about 4.0 eV or more. In this regard, the electrode layer 500 may have a single-layer or multi-layer structure formed of one or more of these materials. Examples of the metal included in the electrode layer 500 include titanium, titanium nitride, tantalum, and tantalum nitride. Examples of the metal silicide included in the electrode layer 500 include tungsten silicide, titanium silicide, and tantalum silicide. The electrode layer 500 may be formed to a thickness of, for example, from about 100 Å to about 3,000 Å.

Figure 13:
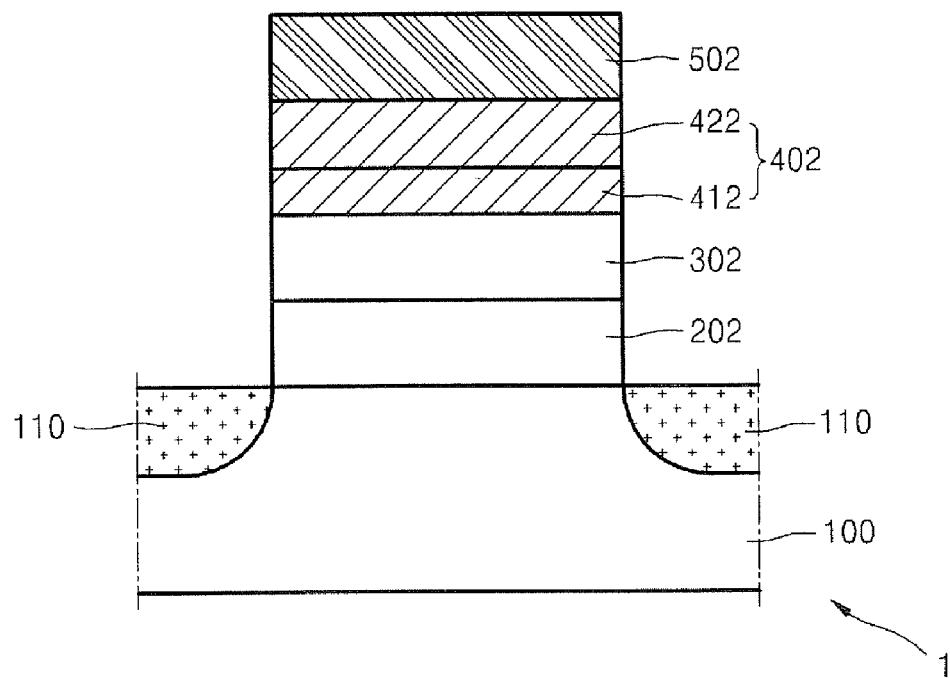
FIG. 13 is a cross-section illustrating an impurity region according to some embodiments of the present invention.

FIG. 13 is a cross-section illustrating an impurity region 110 according to some embodiments of the present invention. Referring to FIG. 13, an etching process is performed using a mask pattern (see 600 of FIG. 12) as an etch mask, thereby forming a gate insulating layer pattern 202, a charge storage layer pattern 302, a blocking insulating layer pattern 402 and a conductive layer pattern 502. The blocking insulating layer pattern 402 may include a lower metal oxide layer pattern 412 and an upper metal oxide layer pattern 422. The mask pattern may be removed using an ashing or stripping process after the etching process. In these embodiments, an additional oxidation process may be performed to repair etch damage which may occur during the etching process.

Then, the impurity region 110 is formed in a portion of the substrate 100 exposed by the gate insulating layer pattern 202, the charge storage layer pattern 302, the blocking insulating layer pattern 402 and the conductive layer pattern 502. The impurity region 110 may function as a source region and a drain region, and may be formed using an ion implantation process and a heat treatment process. Therefore, an individual nonvolatile memory device may be formed. As described above, when the charge storage layer pattern 302 is formed of a conductive material, a flash memory that is a floating gate type nonvolatile memory device is formed. On the other hand, when the charge storage layer pattern 302 is formed of an insulating material, a charge trap type flash memory that is a floating trap type nonvolatile memory device is formed. The structure of the individual nonvolatile memory device illustrated in FIG. 13 is only a basic structure and used to show the relationship between constituent elements. Accordingly, the structure of the individual nonvolatile memory device is not limited to the structure illustrated in FIG. 13.

A channel region (not shown) formed in a portion of the substrate 100 contacting the gate insulating layer pattern 202 may have, for example, a flat structure as illustrated. Furthermore, the channel region may have a modified shape to increase the length of the channel, such as a recess structure or a protrusion structure. According to the structure of the channel region, the substrate 100, the gate insulating layer pattern 202, the charge storage layer pattern 302, the blocking insulating layer pattern 402, and the conductive layer pattern 502 may have various structures. Furthermore, according to some embodiments of the present invention, a spacer (not shown) may be additionally formed on side surfaces of the gate insulating layer pattern 202, the charge storage layer pattern 302, the blocking insulating layer pattern 402 and the conductive layer pattern 502.

Figure 14:
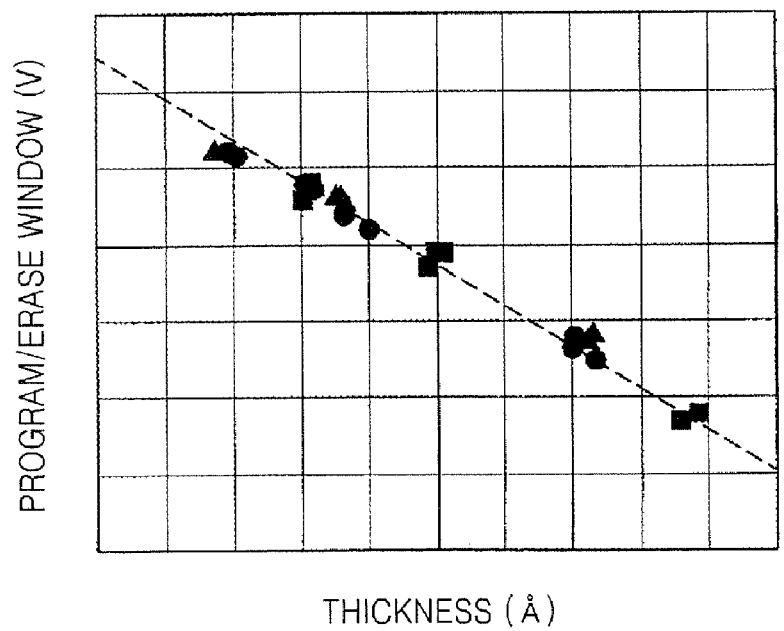
FIG. 14 is a graph illustrating program/erase window characteristics of a conventional nonvolatile memory device and a nonvolatile memory device according to some embodiments of the present invention.

FIG. 14 is a graph illustrating program/erase window characteristics of a conventional nonvolatile memory device and a nonvolatile memory device according to some embodiments of the present invention. A first nonvolatile memory device manufactured using a conventional method includes a silicon oxide layer having a thickness of about 40 Å that functions as a gate insulating layer, a silicon nitride layer having a thickness of about 60 Å that functions as a charge storage layer, an aluminum oxide layer that is formed at a temperature of about 380° C. by ALD and functions as a blocking insulating layer, a tantalum nitride layer having a thickness of about 200 Å that functions as an electrode layer, a tungsten nitride layer having a thickness of about 50 Å that functions as an adhesive layer or a barrier layer, and a tungsten layer having a thickness of about 300 Å that functions as a word line.

A second nonvolatile memory device according to some embodiments of the present invention includes a silicon oxide layer having a thickness of about 40 Å that functions as a gate insulating layer, a silicon nitride layer having a thickness of about 60 Å that functions as a charge storage layer, a first aluminum oxide layer that is formed at a temperature of about 800 to 900° C. by CVD and functions as a lower metal oxide layer, a second aluminum oxide layer that is formed at a temperature of about 380° C. by ALD and functions as an upper metal oxide layer, a tantalum nitride layer having a thickness of about 200 Å that functions as an electrode layer, a tungsten nitride layer having a thickness of about 50 Å that functions as an adhesive layer or a barrier layer, and a tungsten layer having a thickness of about 300 Å that functions as a word line. Herein, the first aluminum oxide layer that functions as the lower metal oxide layer and the second aluminum oxide layer that functions as the upper metal oxide layer together constitute a blocking insulating layer.

Referring to FIG. 14, a program voltage and an ease voltage were applied to the first and second nonvolatile memory devices according to varying thicknesses of the first and second aluminum oxide layers of the second nonvolatile memory device, and according to varying thicknesses of the aluminum oxide layer of the first nonvolatile memory device. Then a program voltage and an erase voltage were applied to the first and second nonvolatile memory devices and respective threshold voltages were measured and program/erase windows were obtained. Specifically, the first nonvolatile memory device was formed and the program/erase window was measured. The results are represented by "■." The second nonvolatile memory device was formed at 900° C. according to varying thicknesses of the first aluminum oxide layer and then the program/erase window was measured. The results are represented by "●." The second nonvolatile memory device was formed at 800° C. according to varying thicknesses of the first aluminum oxide layer and then program/erase window was measured. The results are represented by "▲." In FIG. 14, the dotted line refers to a reference plot of results represented by "■."

Referring to FIG. 14, when program/erase window characteristics with respect to the thickness of the aluminum oxide layer of the first nonvolatile memory device are taken into consideration as a reference, it can be identified that program/erase window characteristics with respect to the thickness of the first aluminum oxide layer of the second nonvolatile memory device are similar to the reference.

Figure 15:
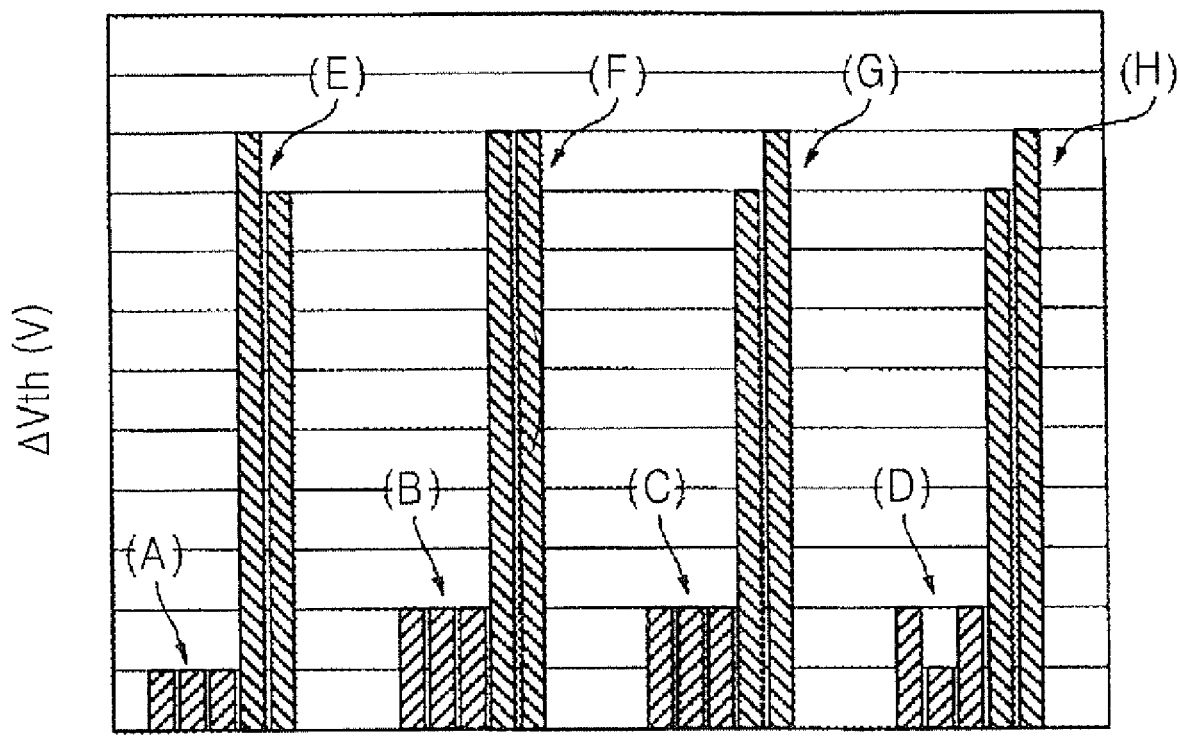
FIG. 15 is a graph illustrating threshold voltage window characteristics of a conventional nonvolatile memory device and a nonvolatile memory device according to some embodiments of the present invention.

FIG. 15 is a graph illustrating threshold voltage window characteristics of a conventional nonvolatile memory device, constituting a first nonvolatile memory device, and nonvolatile memory devices according to some embodiments of the present invention, constituting second nonvolatile memory devices. Referring to FIG. 15, program and erase voltages are applied to the first and second nonvolatile memory devices according to various deposition temperatures of aluminum oxide layers of the first and second nonvolatile memory devices and threshold voltage windows are measured. The threshold voltage windows are compared with an initial value. Furthermore, a high temperature retention test is performed.

To perform the high temperature retention test, the first and second nonvolatile memory devices are baked for about 2 hours at a temperature of about 200° C., and then program/erase voltage are applied to the first and second nonvolatile memory devices and threshold voltage windows are measured and the threshold voltage windows are compared with an initial value. In FIG. 15, (A) shows threshold voltage windows when the first nonvolatile memory device is formed and then program/erase voltages are applied thereto, and (E) shows threshold voltage windows when the baking treatment is performed and program/erase voltages are alternatively applied 1,000 times. In this regard, the equivalent oxide thickness (EOT) of an aluminum oxide layer of the first nonvolatile memory device may be about 133 Å. In addition, in FIG. 15, (B), (C), and (D) respectively show threshold voltage windows when first aluminum oxide layers are formed at deposition temperatures of about 700° C., about 750° C., and about 800° C. to form second nonvolatile memory devices and then program/erase voltages are applied thereto, and (F), (G), and (H) respectively show threshold voltage windows when the baking treatment is performed and program/erase voltages are alternatively applied 1,000 times. In this regard, the sum of EOTs of the first and second aluminum oxide layers of the second nonvolatile memory device is about 123 Å. Herein, each test was performed three times for the first nonvolatile memory device and two times for the second nonvolatile memory devices.

Referring to FIG. 15, for the first nonvolatile memory device, the threshold voltage window value after the baking treatment is about 0.9 V. Furthermore, for the second nonvolatile memory device in which the first aluminum oxide layer is deposited at a deposition temperature of about 700 to 800° C., the threshold voltage window value after the baking treatment is about 0.9 V. That is, even when an aluminum oxide layer is thinner than in the first nonvolatile memory device, the same threshold voltage window can be obtained. Therefore, from these results, it can be identified that the second nonvolatile memory devices according to some embodiments of the present invention have relatively excellent high-temperature retention characteristics.

Figure 16:
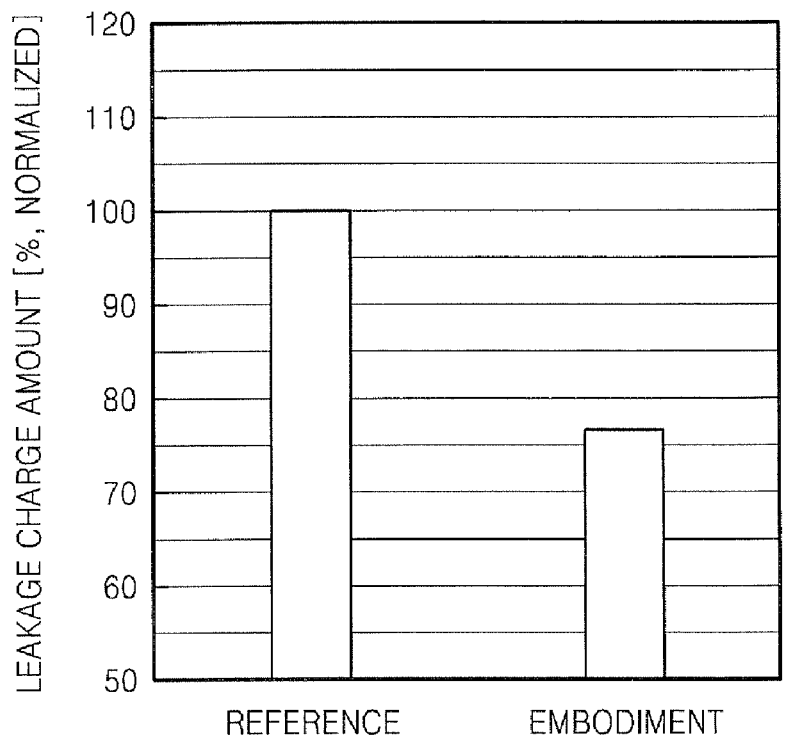
FIG. 16 is a bar chart illustrating a leakage charge amount of a blocking insulating layer according to some embodiments of the present invention and a blocking insulating layer formed of an amorphous insulating material.

FIG. 16 is a bar chart illustrating a leakage charge amount of a blocking insulating layer according to some embodiments of the present invention and a blocking insulating layer formed of an amorphous insulating material. Referring to FIG. 16, the amount of charges that leak from a charge storage layer into an electrode layer according to an insulating layer used as a blocking insulating layer is cumulatively measured under high temperature stress (HTS) to identify a relative difference. The amount of charges leaking from the charge storage layer into the electrode layer in a reference case, that is, when an amorphous aluminum oxide layer having a thickness of about 150 Å is used as a blocking insulating layer (Reference), is set at 100%. The amount of charges leaking from the charge storage layer into the electrode layer in the blocking insulating layer according to some embodiments of the present invention, that is, when an aluminum oxide layer formed to a thickness of about 50 Å in a crystalline phase and an aluminum oxide layer that is formed to about 100 Å in an amorphous phase and then heat treated to be crystallized to constitute a blocking insulating layer (Embodiment), is about 75%, when compared with the reference case. Accordingly, it can be seen that the charge retention capability of the blocking insulating layer according to some embodiments of the present invention is about 25% higher than that in the reference case.

Figure 17:
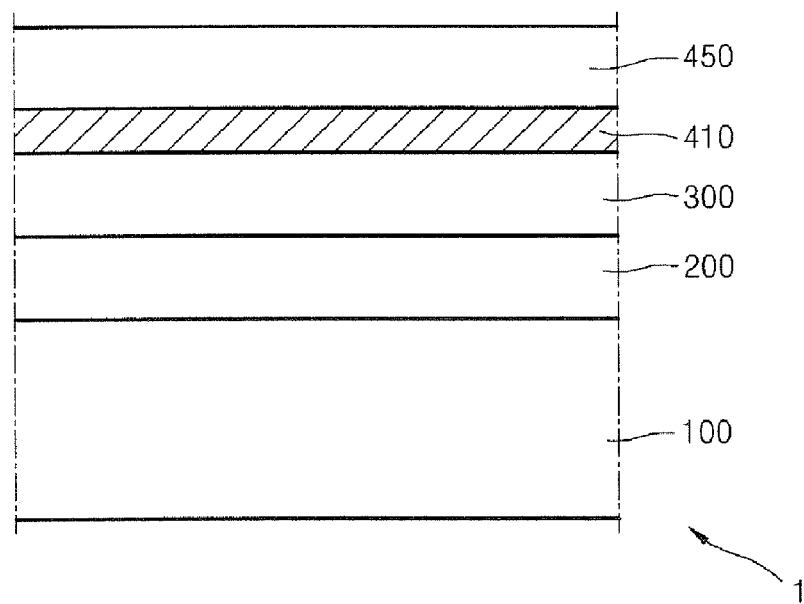
FIG. 17 is a cross-section illustrating a processing step in the fabrication of an intermediate insulating layer on a lower metal oxide layer according to some embodiments of the present invention.

FIG. 17 is a cross-section illustrating a process of forming an intermediate insulating layer 450 on a lower metal oxide layer 410 according to some embodiments of the present invention. Referring to FIG. 17, the lower metal oxide layer 410 is formed as described with reference to FIG. 2, and then the intermediate insulating layer 450 is formed on the lower metal oxide layer 410. The thickness of the lower metal oxide layer 410 may be, for example, from about 5.0 Å to about 150 Å. A crystallized metal oxide layer may have higher surface roughness as the thickness thereof increases. Accordingly, to minimize the surface roughness, the lower metal oxide layer 410 may be formed to a thickness of from about 5.0 Å to about 100 Å.

The intermediate insulating layer 450 may be in an amorphous phase, and may have a dielectric constant lower than that of the lower metal oxide layer 410. For example, the lower metal oxide layer 410 may be an aluminum oxide layer and the intermediate insulating layer 450 may be an oxide layer or may be formed of a silicate-based material. The intermediate insulating layer 450 may be formed at a third temperature by CVD, wherein the third temperature is lower than a first temperature at which the lower metal oxide layer 410 is formed.

Figure 18:
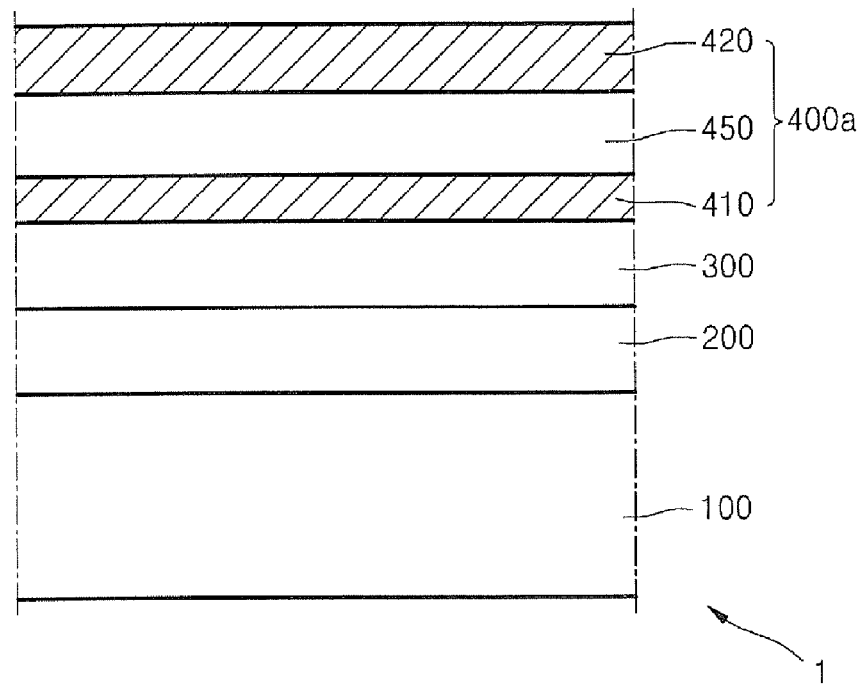
FIG. 18 is a cross-section illustrating a processing step in the fabrication of an upper metal oxide layer on an intermediate insulating layer according to some embodiments of the present invention.

FIG. 18 is a cross-section illustrating a process of forming an upper metal oxide layer 420 on an intermediate insulating layer 420 according to some embodiments of the present invention. Referring to FIG. 18, the upper metal oxide layer 420 is formed on the intermediate insulating layer 450 and the intermediate insulating layer 450 is formed on a lower metal oxide layer 410. The upper metal oxide layer 420 may have a larger dielectric constant than the intermediate insulating layer 450. The upper metal oxide layer 420 may be formed of an oxide of the same metal as in the lower metal oxide layer 410. For example, each of the lower metal oxide layer 410 and the upper metal oxide layer 420 may be an aluminum oxide layer. However, the lower metal oxide layer 410 and the upper metal oxide layer 420 may be different metal oxide layers.

The upper metal oxide layer 420 can be formed in the way as described with reference to FIG. 7. That is, a preliminary upper metal oxide layer is formed in an amorphous phase and then crystallized using a post heat treatment process. In these embodiments, the preliminary upper metal oxide layer may be formed by ALD or CVD at a temperature lower than the first temperature. For example, the preliminary upper metal oxide layer may be formed at a temperature lower than about 200° C. to about 800° C. The post heat treatment process may be a rapid thermal annealing (RTA) process to apply a smaller thermal budget to the intermediate insulating layer 450. The upper metal oxide layer 420 may be formed to a thickness of, for example, 10 Å to 100 Å. Thus, a blocking insulating layer 400a in which the lower metal oxide layer 410 and the upper metal oxide layer 420 which are in the crystalline phase respectively cover lower and upper surfaces of the intermediate insulating layer 450 that is in the amorphous phase may be formed. The blocking insulating layer 400a may have better charge retention capability and less surface roughness than an amorphous blocking insulating layer.

Then, as illustrated with reference to FIGS. 12 and 13, an electrode layer and an impurity region are formed, thereby forming a semiconductor device that is a nonvolatile memory device.

Figure 19:
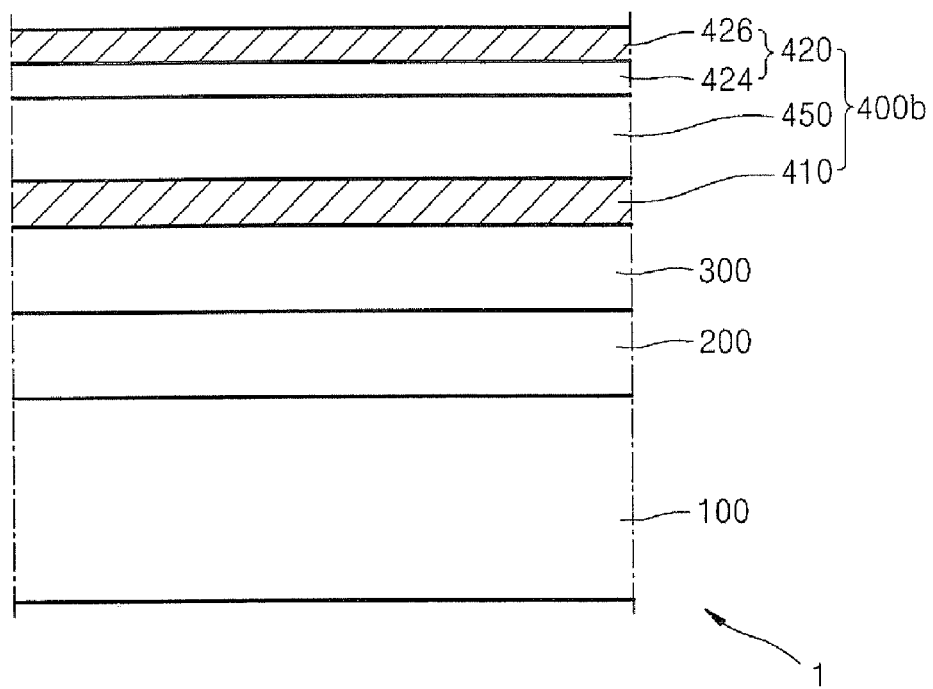
FIG. 19 is a cross-section illustrating a processing step in the fabrication of an upper metal oxide layer on an intermediate insulating layer according to some embodiments of the present invention.

FIG. 19 is a cross-section illustrating a process of forming an upper metal oxide layer 420 on an intermediate insulating layer 450 according to some embodiments of the present invention. Referring to FIG. 19, the upper metal oxide layer 420 including a first upper metal oxide layer 424 and a second upper metal oxide layer 426 is formed on the intermediate insulating layer 450 that is formed as described with reference to Figure. The upper metal oxide layer 420 may be formed to a thickness of about 10 Å to 100 Å. In order words, the combined thickness of the first upper metal oxide layer 424 and the second upper metal oxide layer 426 may be from 10 Å to 100 Å. The first upper metal oxide layer 424 may be formed in the amorphous phase at a relatively low temperature of, for example, about 200° C. to about 700° C. by ALD. In addition, the first upper metal oxide layer 424 may be, for example, an aluminum oxide layer.

The second upper metal oxide layer 426 may be formed in situ in the crystalline phase. The second upper metal oxide layer 426 may be an aluminum oxide layer that is formed in situ in the crystalline phase. The second upper metal oxide layer 426 may be formed in situ in the crystalline phase at a temperature, for example, about 800° C. to about 1300° C. by CVD. In this regard, the temperature at which the second upper metal oxide layer 426 is formed may be appropriately determined not to crystallize the first upper metal oxide layer 424 when the second upper metal oxide layer 426 is formed.

As a result, a blocking insulating layer 400b in which a lower metal oxide layer 410 in the crystalline phase and the second upper metal oxide layer 426 in the crystalline phase respectively cover a lower surface of the intermediate insulating layer 450 and an upper surface of the first upper metal oxide layer 424 may be formed. Due to the existence of the first upper metal oxide layer 424 in the amorphous phase, intermixing between the intermediate insulating layer 450 and the upper metal oxide layer 420 may inhibited or possibly prevented and thus, higher charge retention capability can be obtained, wherein the intermixing may occur when the second upper metal oxide layer 426 is formed in situ in the crystalline phase.

Figure 20:
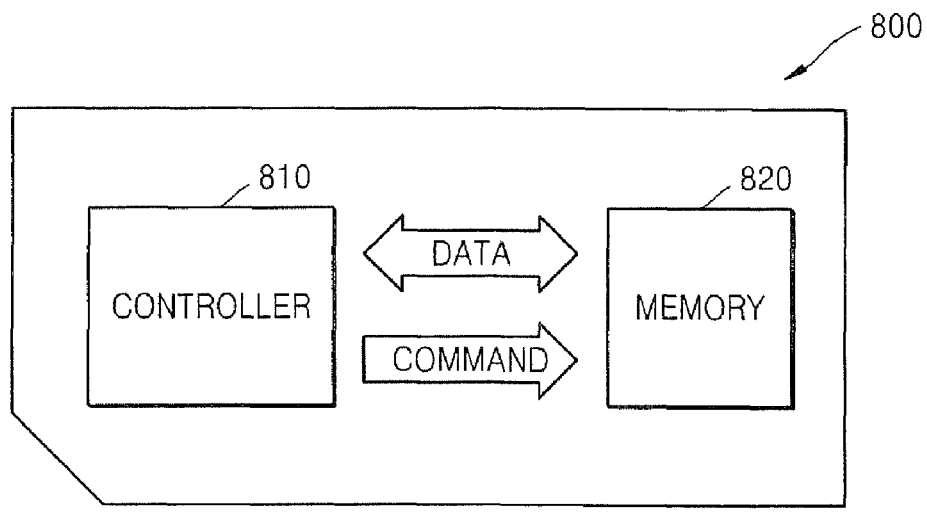
FIG. 20 is a schematic view illustrating a memory card according to some embodiments of the present invention.

FIG. 20 is a schematic view of a memory card 800 according to some embodiments of the present invention. Referring to FIG. 20, a controller 810 and a memory 820 may be disposed such that the controller 810 and the memory 820 can exchange electrical signals with each other. For example, the memory 820 and the controller 810 may exchange data with each other according to a command of the controller 810. Accordingly, the card 800 may store data in the memory 820 or output data from the memory 820.

The memory 820 may include a memory device, such as the semiconductor device described with reference to FIGS. 1-4, 7, 12-13, and 17-19. The memory device used herein may not be limited to a particular memory device and can be, for example, DRAM, SRAM, a flash memory, or a phase change RAM (PRAM).

The card 800 may be used in various mobile electronic devices, such as a multimedia card (MMC) or a secure digital card (SD card).

Figure 21:
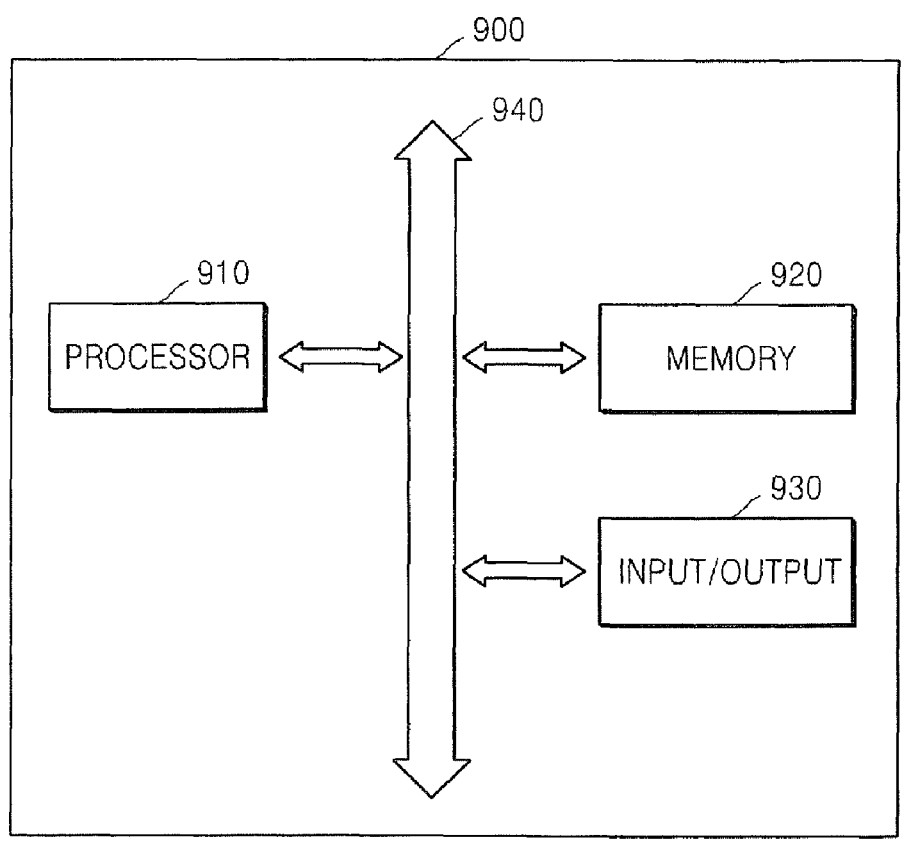
FIG. 21 is a block diagram illustrating a system according to some embodiments of the present invention.

FIG. 21 is a block diagram illustrating a system 900 according to some embodiments of the present invention. Referring to FIG. 21, a processor 910, an input/output 930 and a memory 920 may exchange data through a bus 940. The processor 910 executes a program and controls the system 900. The input/output 930 may be used to input or output data to or from the system 900. The system 900 may be connected to an external device, such as a personal computer or a network, through the input/output 930 and may exchange data with the external device.

The memory 920 may store a code and data for operation of the processor 910. The memory 920 may include a memory device, such as the semiconductor device described with reference to FIGS. 1-4, 7, 12-13, and 17-19. The memory device used herein may not be limited to a particular memory device and can be, for example, DRAM, SRAM, a flash memory, or a phase change RAM (PRAM).

The system 900 may be used in various portable electronic devices, such as mobile phones, MP3 players, navigation devices, solid-state disks (SSDs) or household appliances.

While the present invention has been particularly shown and described with reference to exemplary embodiments thereof, it will be apparent to those skilled in the art that the scope of the invention is given by the appended claims, rather than the preceding description, and all variations and equivalents which fall within the range of the claims are intended to be embraced therein. Therefore, it should be understood that the above embodiments are not limitative, but illustrative in all aspects.

What is claimed is:

1. A method of manufacturing a semiconductor device, comprising:
   forming a charge storage layer on a gate insulating layer that is on a semiconductor substrate;
   forming a blocking insulating layer on the charge storage layer; and
   forming an electrode layer on the blocking insulating layer,
   wherein forming the blocking insulating layer comprises:
      forming a lower metal oxide layer in a chamber at a first temperature; and
      forming an upper metal oxide layer on the lower metal oxide layer in the chamber at a second temperature, lower than the first temperature, wherein the lower metal oxide layer is formed in-situ in a crystalline phase.

2. The method of claim 1, wherein the upper metal oxide layer is formed in-situ in a crystalline phase using the lower metal oxide layer as a seed.

3. The method of claim 1, wherein the upper metal oxide layer is formed in an amorphous phase, and wherein forming the blocking insulating layer further comprises heat-treating the upper metal oxide layer so that the upper metal oxide layer is crystallized.

4. The method of claim 3, wherein heat-treating the upper metal oxide layer comprises crystallizing the upper metal oxide layer using the lower metal oxide layer as a seed.

5. The method of claim 1, wherein the lower metal oxide layer and the upper metal oxide layer are formed using $AlCl_3$ as a precursor.

6. A method of manufacturing a semiconductor device, comprising:
   forming a charge storage layer on a gate insulating layer that is on a semiconductor substrate;
   forming a blocking insulating layer on the charge storage layer; and
   forming an electrode layer on the blocking insulating layer,
   wherein forming the blocking insulating layer comprises:
      forming a lower metal oxide layer in situ in a crystalline phase;
      forming an intermediate insulating layer in an amorphous phase; and
      forming an upper metal oxide layer on the intermediate insulating layer.

7. The method of claim 6, wherein the intermediate insulating layer has a lower dielectric constant than a dielectric constant of the lower metal oxide layer and the upper metal oxide layer.

8. The method of claim 6, wherein the upper metal oxide layer is formed in an amorphous phase, and wherein forming the blocking insulating layer further comprises heat-treating the upper metal oxide layer so that the upper metal oxide layer is crystallized.

9. The method of claim 6, wherein forming the upper metal oxide layer comprises:
   forming a first upper metal oxide layer in an amorphous phase; and
   forming a second upper metal oxide layer in situ in a crystalline phase.

* * * * *